US006756689B2

(12) United States Patent
Nam et al.

(10) Patent No.: US 6,756,689 B2
(45) Date of Patent: Jun. 29, 2004

(54) POWER DEVICE HAVING MULTI-CHIP PACKAGE STRUCTURE

(75) Inventors: Shi-baek Nam, Incheon (KR); O-seob Jun, Seoul (KR)

(73) Assignee: Fairchild Korea Semiconductor, Ltd. (KR)

(*) Notice: Subject to any disclaimer, the term of this patent is extended or adjusted under 35 U.S.C. 154(b) by 0 days.

(21) Appl. No.: 10/337,872

(22) Filed: Jan. 8, 2003

(65) Prior Publication Data

US 2003/0102489 A1 Jun. 5, 2003

Related U.S. Application Data

(63) Continuation of application No. 09/661,383, filed on Sep. 13, 2000.

(30) Foreign Application Priority Data

Sep. 13, 1999 (KR) .............................................. 99-39065

(51) Int. Cl.[7] .............................................. H01L 23/14
(52) U.S. Cl. ...................... 257/783; 257/686; 257/723; 257/724; 257/725
(58) Field of Search ................................ 257/723–725, 257/783, 686, 690, 692, 735–737, 777–778, 769, 787, 173, 177, 678

(56) References Cited

U.S. PATENT DOCUMENTS

| 4,697,095 A | | 9/1987 | Fujii | |
|---|---|---|---|---|
| 4,703,483 A | | 10/1987 | Enomoto et al. | |
| 4,965,702 A | * | 10/1990 | Lott et al. | 361/401 |
| 5,475,918 A | * | 12/1995 | Kubota et al. | 29/827 |
| 5,739,582 A | * | 4/1998 | ElHatem et al. | 257/676 |
| 5,757,070 A | * | 5/1998 | Fritz | 257/675 |
| 5,777,345 A | * | 7/1998 | Loder et al. | 257/777 |
| 5,923,957 A | * | 7/1999 | Song et al. | 438/118 |
| 6,025,212 A | * | 2/2000 | VanNortwick et al. | 438/111 |
| 6,291,880 B1 | * | 9/2001 | Ogawa et al. | 257/723 |

FOREIGN PATENT DOCUMENTS

JP 5326817 12/1993

OTHER PUBLICATIONS

S. Wolf and R.N. Tauber, "Silicon Processing for the VLSI Era", vol. 1—Process Technology, p. 851 (17.5 Bond–Pad to Package Connections, first and second sentence). Second Edition. Lattice Press, Sunset Beach, CA 90742, USA.*

Y. Okugawa et al., "New Type LOC Adhesive Tapes", in Proc. 44th Conf. on Electronic Components and Technology Conference, May 1994, Washington DC. pp. 570–574, ISBN: 0–7803–0914–6. IEEE Cat. No.: 94CH3241–7.*

* cited by examiner

Primary Examiner—Nathan J. Flynn
Assistant Examiner—Johannes Mondt
(74) Attorney, Agent, or Firm—Rothwell, Figg, Ernst & Manbeck

(57) ABSTRACT

A power device having a multi-chip package structure and a manufacturing method therefor are provided. In the power device, a transistor, which is a switching device, and a control integrated circuit (IC) chip, which is a driving device, are mounted together in a package, thereby requiring a high insulation withstand voltage between the transistor chip and the control IC chip. The power device and the manufacturing method can simplify a packaging process by attaching the control IC chip on a chip pad of a lead frame using an insulating adhesive tape at a level with the transistor chip. Furthermore, the overall size of a package in the power device can be reduced by attaching the control IC chip on top of the transistor chip using the insulating adhesive tape. In the case of attaching the control IC chip on the top of the transistor chip, a liquid non-conductive adhesive can be used instead of an insulating adhesive tape.

19 Claims, 3 Drawing Sheets

POWER DEVICE HAVING MULTI-CHIP PACKAGE STRUCTURE

CROSS-RELATED REFERENCE TO RELATED APPLICATION

This application is a continuation of U.S. application Ser. No. 09/661,383, filed Sep. 13, 2000.

BACKGROUND OF THE INVENTION

1. Field of the Invention

The present invention relates to a power device, and more particularly, to a multi-chip package in which a transistor, which is a switching device, and a control-integrated circuit (IC) which is a driving device, are mounted together in a package, thereby requiring a high insulation withstand voltage between the switching device and the control IC, and to a manufacturing method therefor.

2. Description of the Related Art

In power devices, a smart power switching (SPS) product contains a control IC, which is a driving device, and a transistor, which is a switching device. In a packaging process for SPS power devices, two chips are mounted together on one chip pad. However, in this case, an insulation means between the two chips, i.e., a control IC chip and a transistor chip, comes to the front as an important problem. During a packaging process, a common method of insulating the SPS power device is to attach one chip by inserting a ceramic plate or epoxy mold compound plate between die adhesives or to use a liquid non-conductive adhesive.

FIGS. 1 through 3 are cross-sectional views for explaining a conventional insulation method between two chips when the two chips are mounted on a chip pad. FIG. 1 is a cross-sectional view of a power device in which a ceramic plate is inserted between die adhesives for one chip. Specifically, a transistor chip 11, which is a switching device, is attached on a chip pad 10 by a conductive adhesive 12. In addition, a control IC chip 16 is attached by inserting a ceramic plate 15 between die adhesives 13 and 14 to provide insulation from the chip pad 10. Reference numeral 17 in FIG. 1 denotes a mold line coated with an epoxy mold compound that is used as a molding means. However, the above process has some problems in that a ceramic plate is breakable and expensive, so the manufacturing cost increases, and the overall packaging process becomes more complicated since a process of inserting a ceramic plate must be additionally performed therein.

FIG. 2 is a cross-sectional view of a power device in which an EMC plate is inserted between die adhesives for one chip. Specifically, a transistor chip 21, which is a switching device, is attached on a chip pad 20 by a conductive adhesive 22. A control IC chip 26 is attached with the EMC plate 25 inserted between die adhesives 23 and 24 to provide insulation from the chip pad 20. Reference numeral 27 in FIG. 2 denotes a mold line coated with an EMC which is a molding means. In this case, the EMC plate is cheaper than a ceramic plate, but there still remains problems in that a process becomes complicated.

FIG. 3 is a cross-sectional view of a power device in which a liquid non-conductive adhesive is used as a die adhesive. Specifically, a transistor chip 31 is attached on a chip pad 30 by a conductive adhesive 32. A control IC chip 36 is attached by a liquid non-conductive adhesive 35 to provide insulation from the chip pad 30. Reference numeral 37 in FIG. 3 denotes a mold line coated with an EMC which is used as a molding means. However, when using the liquid non-conductive adhesive 35, some problems occur. The overall thickness of a liquid non-conductive adhesive is not completely uniform so that a chip tends to be slanted.

Furthermore, in the course of hardening a liquid non-conductive adhesive after the control IC chip 36 is attached, a void occurs in the liquid conductive adhesive, so that it is difficult to ensure the stable reliability of the products. In addition, the control IC chip 36 and the non-conductive adhesive 35 are not completely attached together so that there is a crevice at the adhesion boundary, which is called delamination. This degrades product reliability.

In addition to the above method, there is a packaging method wherein the two chips are vertically attached to each other. This method has been disclosed in U.S. Pat. No. 5,777,345 titled "Multi-chip Integrated Circuit Package" (Patent date: Jul., 7, 1998), U.S. Pat. No. 4,697,095 titled "Chip-on-Chip Semiconductor Device Having Selectable Terminal" (Patent date: Sep. 29, 1987), and U.S. Pat. No. 4,703,483 titled "Chip-on-Chip Type Integrated Circuit Device" (Patent date: Oct. 27, 1987).

SUMMARY OF THE INVENTION

To solve the above problems, it is a first object of the present invention to provide a power device having a multi-chip package structure which is capable of ensuring sufficient insulation between two chips mounted on a chip pad, simplifying a process, and miniaturizing the overall size of a package.

It is a second object of the invention to provide a manufacturing method for a power device having the multi-chip package structure.

To achieve the first object, the present invention provides a power device having a multi-chip package structure in which a transistor, which is a switching device, and a control IC chip, which is a driving device, are mounted together in a package through a first embodiment. The power device includes a lead frame having a chip pad, an inner lead and an outer lead, a transistor chip, which is a switching device, attached on the chip pad of the lead frame by a conductive adhesive, a control integrated circuit (IC) chip, which is a driving device, attached on the chip pad of the lead frame at the side of the transistor chip by an insulating adhesive tape, a first gold wire for connecting a bond pad of the transistor chip and a bond pad of the control integrated circuit chip, a second gold wire for connecting a bond pad of the transistor chip and a bond pad of the control integrated circuit chip with the inner lead of the lead frame, respectively, and a molding means for molding the chip pad of the lead frame, inner lead, control integrated circuit chip, and first and second gold wires. Preferably, the conductive adhesive is solder, and an insulation withstand voltage required by the transistor chip is in the range of 500–1,000 V.

The insulating adhesive tape is attached at a temperature that is lower than the melting point of the conductive adhesive It has a single layered structure composed of polyimide base thermosetting resin or polyimide base thermoplastic resin or a multi-layered structure such as a triple layered structure comprised of a first adhesive layer, an insulating layer, and a second adhesive layer. In this case, the first and second adhesive layers are preferably polyimide base thermosetting resin or polyimide thermoplastic resin. The thickness of the insulating layer is preferably dependent on the insulation withstand voltage of the transistor chip.

To achieve the first object, the present invention also provides a power device having a multi-chip package in which a transistor, which is a switching device, and a control integrated circuit, which is a driving device, are mounted together in a package, through second and third embodiments. The power device includes a lead frame including a chip pad, an inner lead and an outer lead, a transistor chip, which is a switching device, attached on the chip pad of the lead frame by a conductive adhesive, an insulating adhesive means which overlies the central portion of the transistor chip surface excluding a predetermined region around the perimeter of the transistor chip surface, a control integrated circuit (IC) chip, which is a driving device, attached on the insulating adhesive means, a first gold wire for connecting a bond pad of the transistor chip to a bond pad of the control integrated circuit chip, a second gold wire for connecting a bond pad of the transistor chip and a bond pad of the control integrated circuit chip to the inner lead of the lead frame to one another, respectively, and a molding means for molding the chip pad of the lead frame, inner lead, transistor chip, control integrated circuit chip, and first and second gold wires.

Preferably, the conductive adhesive is solder, and an insulation withstand voltage required by the transistor chip is in the range of 500–1,000 V. Preferably, the insulating adhesive means is an insulating adhesive tape having a single-layered or multilayered structure. The insulating adhesive tape of the single layered structure is polyimide base thermosetting resin or polyimide thermoplastic resin. The insulating adhesive tape of the multilayered structure is a triple layered structure comprised of a first adhesive layer, an insulating layer, and a second adhesive layer. Preferably, the insulating adhesive means is a liquid non-conductive adhesive. The predetermined region which is not overlaid with the insulating adhesive means is at least the distance required for performing wire bonding.

To achieve the second object, the invention provides a manufacturing method for a power device having a multi-chip structure through a first embodiment. The method includes the steps of attaching a transistor chip, which is a switching device, to a chip pad of a lead frame by solder, attaching an insulating adhesive tape on the chip pad of the lead frame at the side of the transistor chip, attaching a control integrated circuit chip, which is a driving device, on top of the insulating adhesive tape using heat and pressure, performing wire bonding on the transistor chip and control integrated circuit chip, and performing a molding process on the resulting material. Preferably, the control integrated circuit chip is attached on the insulating adhesive tape, the surface area of the insulating adhesive tape is larger than the surface area of the control integrated circuit chip so that the distance from the edge of the control integrated circuit chip to the edge of the insulating adhesive tape can be equal to or greater than 100 $\mu$m.

To achieve the second object, the invention also provides a manufacturing method for a power device having a multi-chip structure through second and third embodiments. The method includes the steps of attaching a transistor chip, which is a switching device, to a chip pad of a lead frame by solder, which is a conductive adhesive, forming an insulating adhesive means on top of the transistor chip, attaching a control integrated circuit chip which is a driving device on top of the insulating adhesive means, performing wire bonding on the transistor chip and control integrated circuit chip, and performing a molding process on the resulting material. Preferably, the insulating adhesive means is an insulating adhesive tape or a liquid non-conductive adhesive. If a liquid non-conductive adhesive is used as a conductive adhesive means, after attaching the control integrated circuit chip, a curing process for hardening the liquid non-conductive adhesive is further performed.

According to the present invention, firstly, a packaging process can be further simplified in a power device having a multi-chip package structure in which a transistor, which is a switching device, requiring a high insulation withstand voltage and a control integrated circuit, which is a driving device, are mounted together in one package. Second, the overall size of a package can be miniaturized. Third, the manufacturing cost of the devices is lowered.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
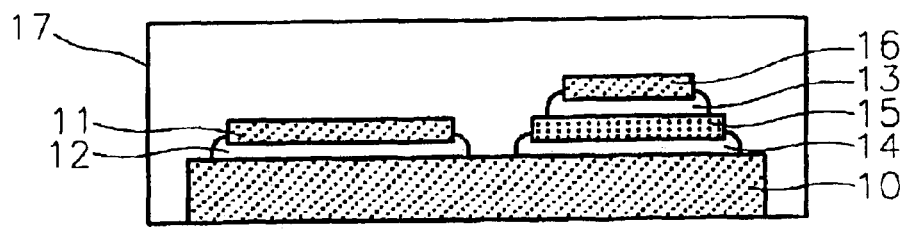
FIG. 1 is a cross-sectional view for explaining a conventional power device having a multi-chip package structure in which a ceramic plate is inserted between die adhesives.
Figure 2:
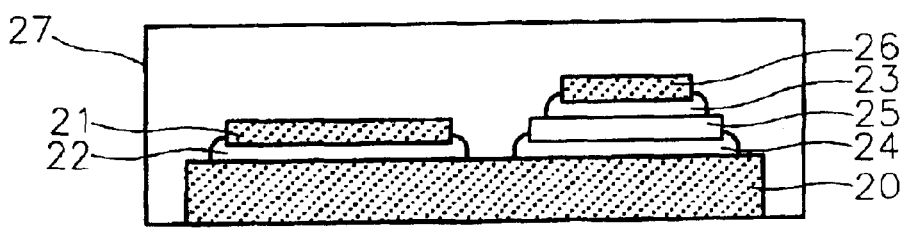
FIG. 2 is a cross-sectional view for explaining a conventional power device having a multi-chip package structure in which an epoxy mold compound (EMC) plate is inserted between die adhesives.
Figure 3:
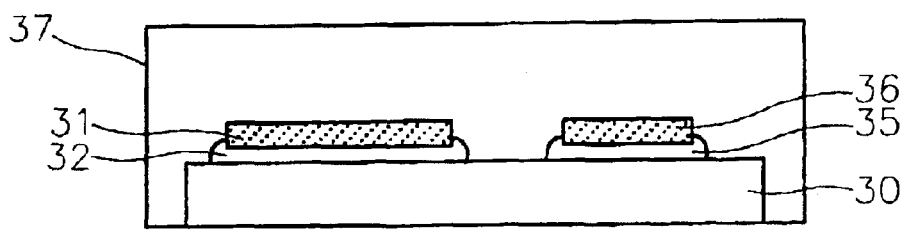
FIG. 3 is a cross-sectional view for explaining a conventional power device having a multi-chip package structure when a liquid non-conductive adhesive is used as a die adhesive.

A lead frame and a package molding means are used in the present invention are used in the broadest sense. Thus, they are not restricted to a specific shape shown in the drawings. The invention may be embodied in many different forms without departing from its spirit and essential distinctive features. For example, although the shape of a lead frame is formed only in one direction in a preferred embodiment, it matters little if it has the same shape as that used in Dual In Line (DIP), Small Out-line (SO), or other forms of packages. Furthermore, a rectangle mold line can be replaced by other shapes. Accordingly, the following illustrated embodiments are only examples, and should not be taken as limiting the scope of the present invention.

First Embodiment

Figure 4:
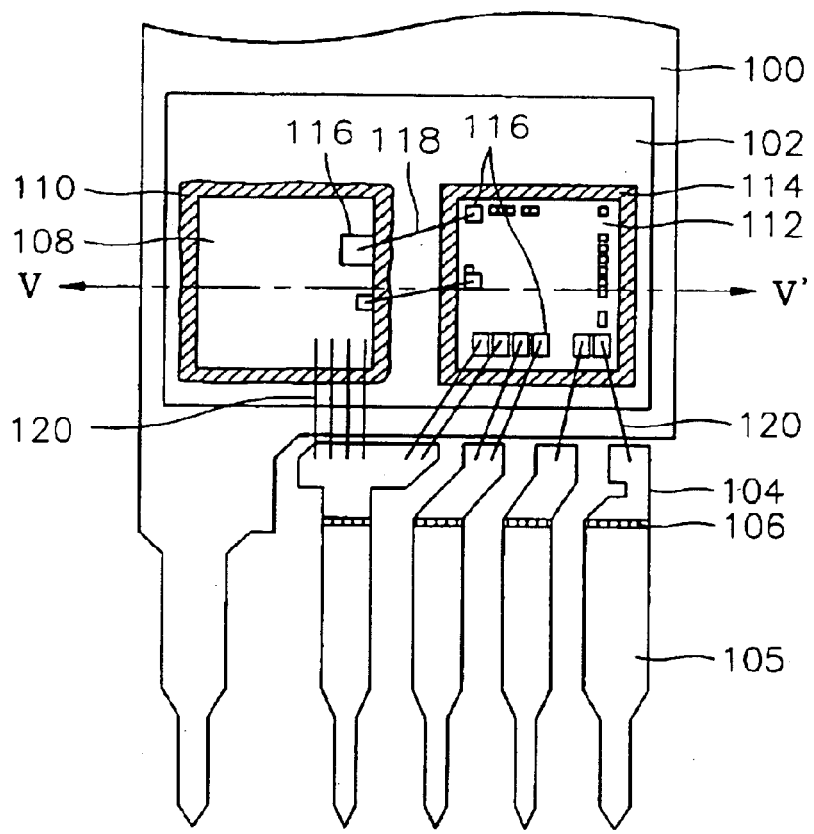
FIG. 4 is a plan view for explaining a power device having a multi-chip package structure according to a first preferred embodiment of the present invention.

In the Case Where a Switching Transistor and a Control Integrated Circuit are Side by Side on a Chip Pad FIG. 4 shows that chips 108 and 112 are attached to a chip pad 102 and wire bonding is completed before a molding process is performed. A power device having a multi-chip package structure according to the present invention includes a lead frame 100 having a chip pad 102, an inner lead 104, and an outer lead 105, a transistor chip 108, which is a switching device, attached to the chip pad 102 of the lead frame 100 by a conductive adhesive 110, a control integrated circuit (IC) chip 112 which is attached on the chip pad 102 of the lead frame 100 by an insulating adhesive tape 114 at the side of the transistor chip 108, a first gold wire 118 for connecting a bond pad 116 of the transistor chip 108 to a bond pad 116 of the control IC chip 112, a second gold wire 120 for connecting a bond pad 116 of the transistor chip 108 to a bond pad 116 of the control IC chip 112 to an inner lead 104 of the lead frame 100, respectively, and a molding means (reference numeral 128 in FIG. 5) for molding the lead frame chip pad 102, the inner lead 104, the transistor chip 108, the control IC chip 112 and the first and second gold wires 118 and 120. In FIG. 4, reference numeral 106 denotes a coining portion for performing wire bonding on the end portion of the inner lead 104.

In this case, the control IC chip 112 is attached to the chip pad 102 by the insulating adhesive tape in order to preserve the insulation of the control IC chip 112 from the transistor chip 108 requiring a high withstand voltage in the range of 500–1000 V. This is a main means for achieving the objects of the present invention. In the conventional art, a control IC chip is insulated using a ceramic plate (reference numeral 15 of FIG. 1) or an epoxy mold compound (EMC) plate, which increases a manufacturing cost and complicates a die attaching process. Furthermore, the conventional method causes a degradation in product yield rate and reliability because it requires an additional process of attaching a ceramic plate or an EMC plate and a curing process for hardening die adhesives 13 and 14.

Contrary to the conventional art, the present invention is capable of performing a die attaching process in a simple way, because the control IC chip 112 is attached to the chip pad 102 by the insulating adhesive tape 114. Furthermore, the present invention lowers the manufacturing cost since neither a ceramic plate nor an EMC plate is used therein, while promoting yield rate and increasing product reliability.

In order to secure a sufficient insulation withstand voltage, the size of the insulating adhesive tape 114 has to be larger than that of the control IC chip 112. To this end, it is desirable that distance between the edge of control IC chip 112 and the edge of the insulating adhesive tape 114 is equal to or greater than 100 μm.

Figure 5:
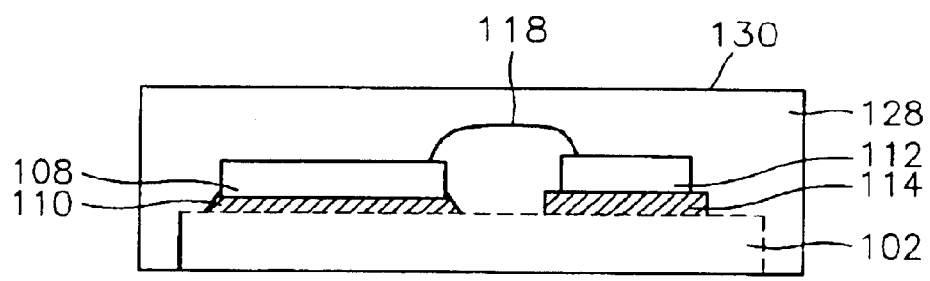
FIG. 5 is a cross-sectional view for explaining a power device having a multi-chip package structure according to a first preferred embodiment of the present invention.

FIG. 5 is a cross-sectional view taken along line V–V' of FIG. 4 for indicating the state when a molding process is completed. Solder is usually used as a conductive adhesive 110. Therefore, since the control IC chip 112 is attached by the insulating adhesive tape 114 after the transistor chip 108 is attached by solder, it is preferable to use an insulating adhesive tape which has the properties of being attached at a temperature lower than the melting point of the solder. A single layered or multilayered polyimide base thermoplastic or thermosetting resin is used as the insulating adhesive tape 114. Reference numeral 130 in FIG. 5 denotes a mold line, i.e., a region for forming an EMC which is a molding means when a molding process is completed.

Figure 6:
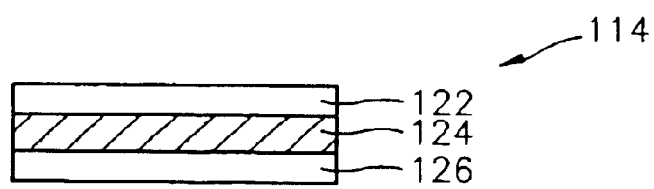
FIG. 6 is a cross-sectional view for explaining the structure of an insulating adhesive tape used in the present invention.

FIG. 6 is a cross-sectional view showing the structure of an insulating adhesive tape used in the present invention. Referring to FIG. 6, the insulating adhesive tape 114 has a multilayered structure which contains a first adhesive layer 122, an insulating layer 124, and a second adhesive layer 126. The first and second adhesive layers 122 and 126 are made of poyimide base thermoplastic resin or thermosetting resin. The insulating layer 124 is made mainly of polyimide having a large dielectric strength. It is desirable that the dielectric strength of insulating layer 124 should be such that a voltage of higher than 5,000 V can be insulated per area having length/breadth of 25 μm at a temperature of 200° C.

If an insulating adhesive tape 114 has a triple layered structure, the thicknesses of the first and second adhesive layers are 25 μm, respectively, and the thickness of the insulating layer 124 is 50 μm, so its overall thickness is 100 μm. However, if the insulating adhesive tape 114 is used in a product requiring a high insulation withstand voltage the insulating layer 124 may be thicker. Conversely, if the insulating adhesive tape 114 is used in a product demanding a low insulation withstand voltage, it may be thinner than that, and if necessary, a single layer structured insulating adhesive tape made of polyimide is used without including the insulating layer 124. A general SPS device demands an insulation withstand voltage of 650 V or 800 V. Thus, if the quality and thickness of an insulating adhesive tape are adjusted depending on the degree of an insulating withstand voltage that a product requires, it is possible to ensure a sufficient insulation withstand voltage between two chips without use of a ceramic or an EMC plate, while simplifying a process.

Manufacturing Method

A manufacturing method for the power device having a multi-chip package structure according to the first embodiment of the present invention will now be described. In connection therewith, firstly, a transistor chip, which is a switching device, is attached to a chip pad of a lead frame using solder which is a conductive adhesive. Then, on the lead frame, an insulating adhesive tape is attached at the side of the transistor chip, and a control IC chip is attached on the insulating adhesive tape at appropriate temperature and pressure, i.e., at a temperature of 250–300° C. and at a pressure of 150–300 mg. For a subsequent process, wire bonding is performed on the transistor chip and the control IC chip, and then a molding process is performed on the resulting material using an EMC.

In the conventional process, a ceramic plate or an EMC plate is attached by a die adhesive, on top of which a control IC chip is attached by a die adhesive. This process is not only complicated but also is likely to cause default in a die adhesive, such as void, delamination, and die tilt, thus lowering yield rate and product reliability. In contrast, a control IC chip is attached only by an insulating adhesive tape in the present invention, which solves the above problems while providing a sufficient insulation characteristic.

Second Embodiment

In the Case Where a Switching Transistor and a Control IC are Stacked on a Chip Pad Using an Insulating Adhesive Tape Since the planar structures of power devices having a multi-chip package structure in a second embodiment and a third embodiment described later are actually the same, their planar structures are described with one drawing. A difference between the second and third embodiments is that the former uses an insulating adhesive tape as an insulating adhesive means and the latter uses a liquid non-conductive adhesive as such. To aid in understanding, the reference numerals therein correspond to those of similar members in the first embodiment, and an explanation of those parts will be omitted to avoid redundancy.

Figure 7:
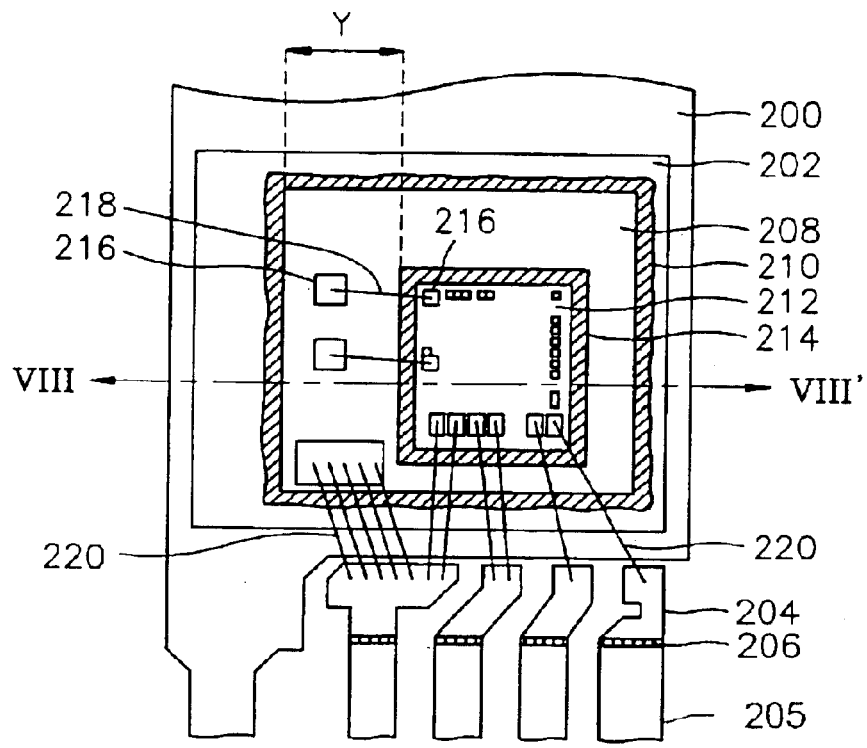
FIG. 7 is a plan view for explaining power devices having a multi-chip package structure according to second and third embodiments of the present invention.

FIG. 7 is a plan view for explaining power devices having a multi-chip package structure according to second and third embodiments of the present invention. Referring to FIG. 7, the power device having a multi-chip package structure according to the second and third embodiments of the present invention includes a lead frame 200 having a chip pad 202, inner lead 204, and outer lead 205, a transistor chip 208, which is a switching device, attached to the chip pad 202 of the lead frame 200 by a conductive adhesive 210, an insulating adhesive means 214 which overlies the remaining central portion of the transistor chip 208 surface excluding a perimeter region with a predetermined width for performing a wire bonding process, control IC chip 212 attached on top of the insulating adhesive means 214, a first gold wire 218 for connecting a bond pad of the control IC chip 212 to a bond pad of the transistor chip 208, a second gold wire 220 for connecting a bond pad of the transistor chip 208 and a bond pad of the control IC chip 212 to the inner lead 204 of the lead frame 200, respectively, and a molding means (reference numeral 230 of FIG. 8) for molding the chip pad 202 of the lead frame 200, inner lead 204, transistor chip 208, control IC chip 212, and the first and second gold wires 218 and 220.

In this case, an insulating adhesive tape serves as the insulating adhesive means 214 in the second embodiment while a liquid non-conductive adhesive serves as the insulation adhesive means 214 in the third embodiment. In FIG. 7, reference numerals 206 and 216 denote a coining portion and a bond pad of the chip, respectively. Reference character "Y" denotes the distance from the edges of transistor chip 208 to the insulating adhesive means 214, i.e., the minimum space for performing a wire bonding process.

Figure 8:
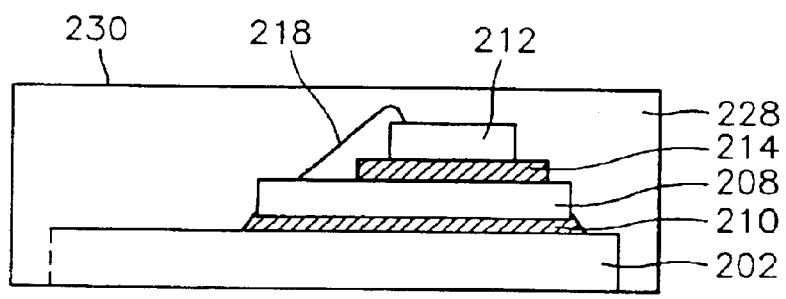
FIG. 8 is a cross-sectional view for explaining a power device having a multi-chip package structure according to a second embodiment of the present invention.

FIG. 8 is a cross-sectional view of a power device having a multi-chip package structure according to a second embodiment of the present invention taken along line VII-I–VIII'. Referring to FIG. 8, a transistor chip 208 is initially attached using solder which is a conductive adhesive 210, and then a control IC chip 212 is mounted on the transistor chip 208 by the insulating adhesive tape 214 which is an insulating adhesive means.

The important thing in this case is that insulation between the two chips 208 and 212 is insignificant unlike the first embodiment. This is because a passivation layer provided on the surface of the transistor chip 208 serves to ensure insulation between the relevant two chips, thus allowing a vertical disposition of the two chips to secure insulation of the two chips. Furthermore, use of the insulating adhesive tape 214 simplifies a process of attaching the control IC chip 212 since a curing process does not have to be performed during a die attaching process, while improving product reliability since it prevents the occurrence of defects such as die tilt. In addition, the overall size of a power device having a multi-chip package structure can be miniaturized through a reduction in the size of the chip pad 202. As a result, the manufacturing cost can be reduced and this technique can be applied to other miniature products.

Manufacturing Method

At the outset, a transistor chip, which is a switching device, is attached to a chip pad of a lead frame by solder which is a conductive adhesive. Then, an insulating adhesive tape that is used as an insulating adhesive means is formed on top of the transistor chip. Next, a control IC chip is attached on the insulating adhesive tape at appropriate temperature and pressure. For a subsequent process, wire bonding is performed on the transistor chip and the control IC chip, and then a molding process is performed on the resulting material to complete manufacturing the power device having a multi-chip package structure according to the second embodiment.

Third Embodiment

Figure 9:
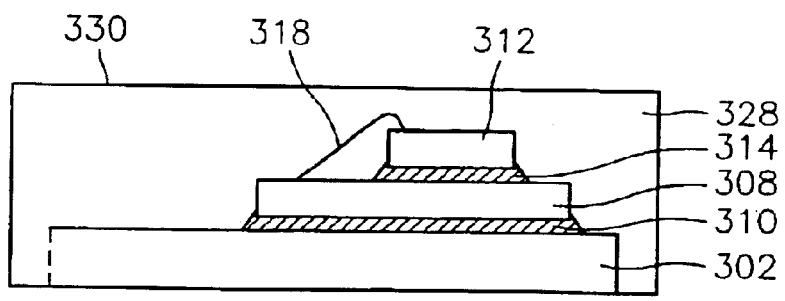
FIG. 9 is a cross-sectional view for explaining a power device having a multi-chip package according to a third embodiment of the present invention.

In the Case Where a Switching Transistor and a Control IC Chip are Stacked on a Chip Pad Using a Liquid Non-Conductive Adhesive FIG. 9 is a cross-sectional view of a power device having a multi-chip package according to a third embodiment of the present invention, taken along line VIII–VIII' of FIG. 7. Excluding the fact that a liquid non-conductive adhesive 314 is used as an insulating adhesive means in the third embodiment instead of the insulating adhesive tape in the second embodiment, the structure of the third embodiment is the same as that of the second embodiment. The liquid non-conductive adhesive 314 is similar to a common conductive adhesive 310 in many aspects, but the former differs from the latter in that it changes the conductivity of an adhesive by using silica particles instead of Ag particles as a filler. When it comes to a manufacturing method, the third embodiment has the same method as the second embodiment except that a curing process for hardening the liquid non-conductive adhesive 314 is further performed after the control IC chip 312 is attached.

Thus, according to the present invention, first, during a packaging process for a power device having a multi-chip package structure, the invention allows for simplification of the process itself. Second, the invention allows for reduction in the manufacturing cost of products. Third, the invention promotes the product yield rate due to simplification of the manufacturing process, while improving product reliability. Fourth, the size of a product can be miniaturized.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A power device having a multi-chip package structure in which a transistor, which is a switching device, and a control IC chip, which is a driving device, are mounted together in a package, the power device comprising:

a lead frame having a chip pad, an inner lead and an outer lead;

a transistor chip, which is a switching device, attached on the chip pad of the lead frame by a conductive adhesive;

a control integrated circuit (IC) chip, which is a driving device, attached on the chip pad of the lead frame at the side of the transistor chip by an insulating adhesive tape;

a first gold wire for connecting a bond pad of the transistor chip and a bond pad of the control integrated circuit chip;

a plurality of second gold wires for connecting a bond pad of the transistor chip to the inner lead of the lead frame and a bond pad of the control integrated circuit chip to the inner lead of the lead frame; and a molding means for molding the chip pad of the lead frame, inner lead, control integrated circuit chip, and first and second gold wires.

2. The power device of claim 1, wherein the conductive adhesive is solder.

3. The power device of claim 1, wherein an insulation withstand voltage required by the transistor chip is in the range of 500–1,000 V.

4. The power device of claim 1, wherein the insulating adhesive tape is attached at a temperature that is lower than the melting point of the conductive adhesive.

5. The power device of claim 1, wherein the insulating adhesive tape has a multi-layered structure.

6. The power device of claim 5, wherein the multi-layered structure is a triple layered structure.

7. The power device of claim 6, wherein the triple layered structure is comprised of a first adhesive layer, an insulating layer, and a second adhesive layer.

8. The power device of claim 1, wherein the device is manufactured according to a method comprising the steps of:

attaching a transistor chip, which is a switching device, to a chip pad of a lead frame by solder;

attaching an insulating adhesive tape on the chip pad of the lead frame at the side of the transistor chip;

attaching a control integrated circuit chip, which is a driving device, on top of the insulating adhesive tape using heat and pressure;

performing wire bonding on the transistor chip and control integrated circuit chip; and performing a molding process on the resulting material.

9. The method of claim 8, wherein, when the control integrated circuit chip is attached on the insulating adhesive tape, the surface area of the insulating adhesive tape is larger than the surface area of the control integrated circuit chip so that the distance from the edge of the control integrated circuit chip to the edge of the insulating adhesive tape can be equal to or greater than 100 μm.

10. A power device having a multi-chip package structure in which a transistor, which is a switching device, and a control IC chip, which is a driving device, are mounted together in a package, the power device comprising:

a lead frame including a chip pad, an inner lead and an outer lead;

a transistor chip, which is a switching device, attached on the chip pad of the lead frame by a conductive adhesive;

an insulating adhesive means which overlies the central portion of the transistor chip surface excluding a predetermined region around the perimeter of the transistor chip surface;

a control integrated circuit (IC) chip, which is a driving device, attached on the insulating adhesive means;

a first gold wire for connecting a bond pad of the transistor chip to a bond pad of the control integrated circuit chip;

a plurality of second gold wires for connecting a bond pad of the transistor chip to the inner lead of the lead frame and a bond pad of the control integrated circuit chip to the inner lead of the lead frame; and a molding means for molding the chip pad of the lead frame, inner lead, transistor chip, control integrated circuit chip, and first and second gold wires.

11. The power device of claim 10, wherein the conductive adhesive is solder.

12. The power device of claim 10, wherein an insulation withstand voltage required by the transistor chip is in the range of 500–1,000 V.

13. The power device of claim 10, wherein the insulating adhesive means is an insulating adhesive tape having a single-layered or multilayered structure.

14. The power device of claim 10, wherein the insulating adhesive means is a liquid non-conductive adhesive.

15. The power device of claim 10, wherein the predetermined region which is not overlaid with the insulating adhesive means is at least the distance required for performing wire bonding.

16. The power device of claim 10, wherein the device is manufactured by a method comprising the steps of:

attaching a transistor chip, which is a switching device, to a chip pad of a lead frame by solder, which is a conductive adhesive;

forming an insulating adhesive means on top of the transistor chip;

attaching a control integrated circuit chip which is a driving device on top of the insulating adhesive means;

performing wire bonding on the transistor chip and control integrated circuit chip; and performing a molding process on the resulting material.

17. The method of claim 16, wherein the insulating adhesive means is an insulating adhesive tape.

18. The method of claim 16, wherein the insulating adhesive means is a liquid non-conductive adhesive.

19. The method of claim 18, wherein, after attaching the control integrated circuit chip, a curing process for hardening the liquid non-conductive adhesive is further performed.

* * * * *